United States Patent
Stroeble

(10) Patent No.: US 6,466,635 B1
(45) Date of Patent: Oct. 15, 2002

(54) PROCESS AND DEVICE FOR GENERATING A CLOCK SIGNAL

(75) Inventor: Olaf Stroeble, La Tronche (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/400,237

(22) Filed: Sep. 21, 1999

(30) Foreign Application Priority Data

Sep. 30, 1998 (FR) ............................................. 98 12250

(51) Int. Cl.[7] ................................................. H03D 3/02
(52) U.S. Cl. ......................... 375/376; 375/362; 375/371; 375/375; 375/373; 327/156; 327/162; 331/1 R; 331/25
(58) Field of Search .................................. 375/362, 364, 375/371, 373, 375, 376; 327/40, 44, 47, 72, 145, 156, 162, 147; 331/18, 25, 1 R

(56) References Cited

U.S. PATENT DOCUMENTS

| 4,931,748 A | * | 6/1990 | McDermott et al. | ......... 331/1 A |
| 5,373,254 A | * | 12/1994 | Nakauchi et al. | ............ 331/1 A |
| 5,546,434 A | * | 8/1996 | Kalafatis | ..................... 331/1 A |
| 5,561,390 A | * | 10/1996 | Hiiragizawa | ................. 327/147 |
| 5,610,954 A | * | 3/1997 | Miyashita et al. | ........... 327/157 |
| 5,790,614 A | | 8/1998 | Powell | ......................... 375/376 |
| 5,828,243 A | * | 10/1998 | Bagley | ........................ 327/144 |
| 5,828,870 A | * | 10/1998 | Gunadisastra | ................ 713/401 |
| 6,081,572 A | * | 6/2000 | Filip | ........................... 327/147 |

FOREIGN PATENT DOCUMENTS

| DE | 2815984 | 10/1979 | ............ G01R/23/02 |
| EP | 0644657 A1 | 3/1995 | ............ H03L/7/087 |
| WO | WO 81/01928 | 7/1981 | ............. H03L/7/00 |

OTHER PUBLICATIONS

Urbansky et al, *Design Aspects and Analysis of SDH Equipment Clocks*, Jan. 1, 1996, vol. 7 No. 1 pp. 39–48, p. 41 col. 1 line 37, p. 42 col. 2 line 16, XP000580347.

Perrott et al., *A 27–Michael W. Taylor CMOS Fractional–N Synthesizer Using Digital Compensation for 2.5–Mb/s GFSK Modulation*, IEEE Journal of Solid–State Circuits, Dec. 1, 1997, vol. 32 No. 12, pp. 2048–2060, XP000767454.

* cited by examiner

*Primary Examiner*—Chi Pham
*Assistant Examiner*—Khanh Long Tran
(74) *Attorney, Agent, or Firm*—Lisa K. Jorgenson; Allen, Dyer, Doppelt, Milbrath & Gilchrist, P.A.

(57) ABSTRACT

An output clock signal is generated from a main clock signal having a predetermined main frequency and from a secondary clock signal generated by a quartz crystal. A frequency synthesizer is preprogrammed to generate two output clock signals whose respective frequencies are slightly greater than and slightly less than the frequency of the main clock signal. The synthesizer switches between the two output clock signals depending on the phase error between the selected output clock signal and the main clock signal.

21 Claims, 3 Drawing Sheets

PROCESS AND DEVICE FOR GENERATING A CLOCK SIGNAL

FIELD OF THE INVENTION

The invention relates to the field of electronics, and, more particularly, to a clock circuit.

BACKGROUND OF THE INVENTION

In digital data transmission systems, the clock signal for recovering the data within the receiver must be locked onto the clock signal used for transmission. Generally, the transmitter requires a very stable clock signal. To generate the clock recovery signal within the receiver, subsequently also referred to as the main clock signal, conventional clock recovery systems are used. The main clock signal may disappear temporarily for various reasons. In this case, provision is made to use a quartz crystal which generates a secondary clock signal having a frequency equal to the frequency of the main clock signal and, therefore, of the clock signal of the transmitter.

However, the frequency of the main clock signal and that of the secondary clock signal may differ by a few tens of parts per million (ppm) depending on the accuracy of the quartz crystal. As a result, on detecting the loss of the main clock signal and switching over to the secondary clock signal, digital data may be lost on account of the frequency and phase differences between the secondary clock signal and the main clock signal which has just been lost.

To remedy these drawbacks, one approach includes using a conventional phase-locked loop. One of the inputs of the phase comparator receives either the main clock signal if present, or the secondary clock signal generated by the quartz crystal should the main signal be lost. If the phase difference between the main signal, which has just been lost, and the signal transmitted by the quartz crsytal is relatively large when switching the signal at the input of the phase comparator, then large variations in phase and frequency occur. This is due, in particular, to the variation in the current injected into the filter of the phase-locked loop.

The gap between the frequency of the output signal from the phase-locked loop and the frequency of the main clock signal may then be temporarily relatively high. This leads, for example, to an output clock signal having a relatively higher frequency than that of the main clock signal. Under these conditions, the buffer memories which are customarily used to store the data received may be filled more rapidly than anticipated causing losses of data on reception.

Attempts have been made to reduce the value of the resistance of the filter of the phase-locked loop, in particular, with respect to the frequency jumps during the transient phase. However, this leads to larger time constants and, consequently, to higher durations for phase locking and phase jitter. These higher values are incompatible with certain applications.

SUMMARY OF THE INVENTION

An object of the present invention is to generate an output clock signal whose frequency gap with respect to the frequency of the main clock signal remains permanently below a predetermined threshold. The predetermined threshold may be small, for example, 100 ppm in absolute value, particularly during a temporary loss of the main clock signal. Should the main clock signal be lost, the generated output clock signal eliminates large jumps in phase and frequency which are detrimental to the reception of digital data. The reception of digital data may be information transmitted by a satellite link, for example.

The present invention provides a process for generating an output clock signal from a main clock signal having a predetermined main frequency and from a secondary clock signal generated by a quartz crystal. A frequency synthesizer, which receives the secondary clock signal, is controlled by a two-state control logic signal. The synthesizer selectively generates a first or a second auxiliary clock signal as the output clock signal. This is dependent upon whether the control signal is in its first or second state. The first auxiliary signal has a first auxiliary frequency equal to the value of the main frequency plus a predetermined frequency gap (about +50 ppm, for example) greater than the frequency accuracy of the secondary clock signal.

The second auxiliary signal has a second auxiliary frequency equal to the value of the main frequency minus the predetermined frequency gap (about −50 ppm, for example). One of the two states of the control logic signal is then determined as a function of the phase difference between the auxiliary clock signal delivered by the frequency synthesizer and, the main clock signal which may possibly be altered. The output clock signal is generated at the output of the frequency synthesizer. The output clock signal has a gap in frequency with respect to the main frequency and remains permanently below a predetermined threshold (about ±100 ppm, for example). This predetermined threshold depends on the frequency gap and on the frequency accuracy of the generator for the secondary signal, which may be a quartz crystal. This is done even when the main signal is lost.

In other words, the generated output clock signal is permanently one of the two auxiliary clock signals preprogrammed into the frequency synthesizer. The selection of which depends on the phase difference between the output signal from the synthesizer and the main clock signal. The predetermined threshold is about ±100 ppm for the gap in frequency of the output clock signal with respect to the frequency of the main clock signal. This is equal to the sum of the frequency gap preprogrammed into the synthesizer, and the frequency gap is about 50 ppm. The accuracy of the quartz crystal is about 50 ppm.

According to one mode of implementation of the process, the control logic signal has its first state when the auxiliary signal delivered by the synthesizer, i.e., the output clock signal, exhibits a phase lag with respect to the main signal. The synthesizer is forced to output the first auxiliary signal whose frequency is slightly greater than that of the main signal. The control logic signal has its second state when the auxiliary signal delivered by the synthesizer has a phase lead with respect to the main signal. The synthesizer is forced to output the second auxiliary signal, i.e., the one having a slightly lower frequency than that of the main signal.

An electronic device for generating an output clock signal includes a main input for receiving a main clock signal having a predetermined main frequency, as well as a generator for generating a secondary clock signal. The electronic device also includes a frequency synthesizer receiving the secondary clock signal as well as a two-state control logic signal. The frequency synthesizer generates as the output clock signal one of the first and second auxiliary clock signals. This is dependent upon whether the control logic signal is in its first or second states.

The first auxiliary signal has a first auxiliary frequency equal to the value of the main frequency plus a predetermined frequency gap greater than the frequency accuracy of the secondary clock signal. The second auxiliary signal has a second auxiliary frequency equal to the value of the main frequency minus the predetermined frequency gap.

The device further includes a controller having a first control input linked to the main input, i.e., receiving the main clock signal that may possibly be altered, and a second control input linked to the output of the frequency synthesizer, i.e., receiving one of the two auxiliary signals which is actually the output clock signal. The controller delivers the control logic signal with one of the these two states as a function of the phase difference between the respective signals present at the two control inputs.

According to one embodiment of the device, the controller provides the control logic signal with its first state when the signal present at the second control input, i.e., the output signal from the synthesizer, exhibits a phase lag with respect to the signal present at the first control input. The control logic signal is provided with its second state when the signal present at the second control input has a phase lead with respect to the signal present at the first control input.

The controller advantageously includes a phase and frequency detector whose two inputs are connected to the two control inputs, and delivers on its two outputs two pulses whose respective durations depend on the phase difference between the signals present at the two inputs. Two low-pass filters are respectively connected to the two outputs of the phase and output detector. These two low-pass filters average the pulses delivered by the frequency and phase detector. The controller also includes a comparator whose two inputs are connected to the two outputs of the two filters, and whose output delivers the control logic signal.

To insure that the level of the signal delivered by each filter is not below the offset voltage of the comparator, the controller advantageously includes two level-offsetting circuits preceding the comparator for increasing the level of each signal delivered by each filter by the same predetermined value.

BRIEF DESCRIPTION OF THE DRAWINGS

Other advantages and characteristics of the invention will become apparent on examining the detailed description for the modes of implementation and embodiments, which are in no way limiting, and of the appended drawings in which.

DETAILED DESCRIPTION OF THE PREFERRED EMBODIMENTS

Figure 1:
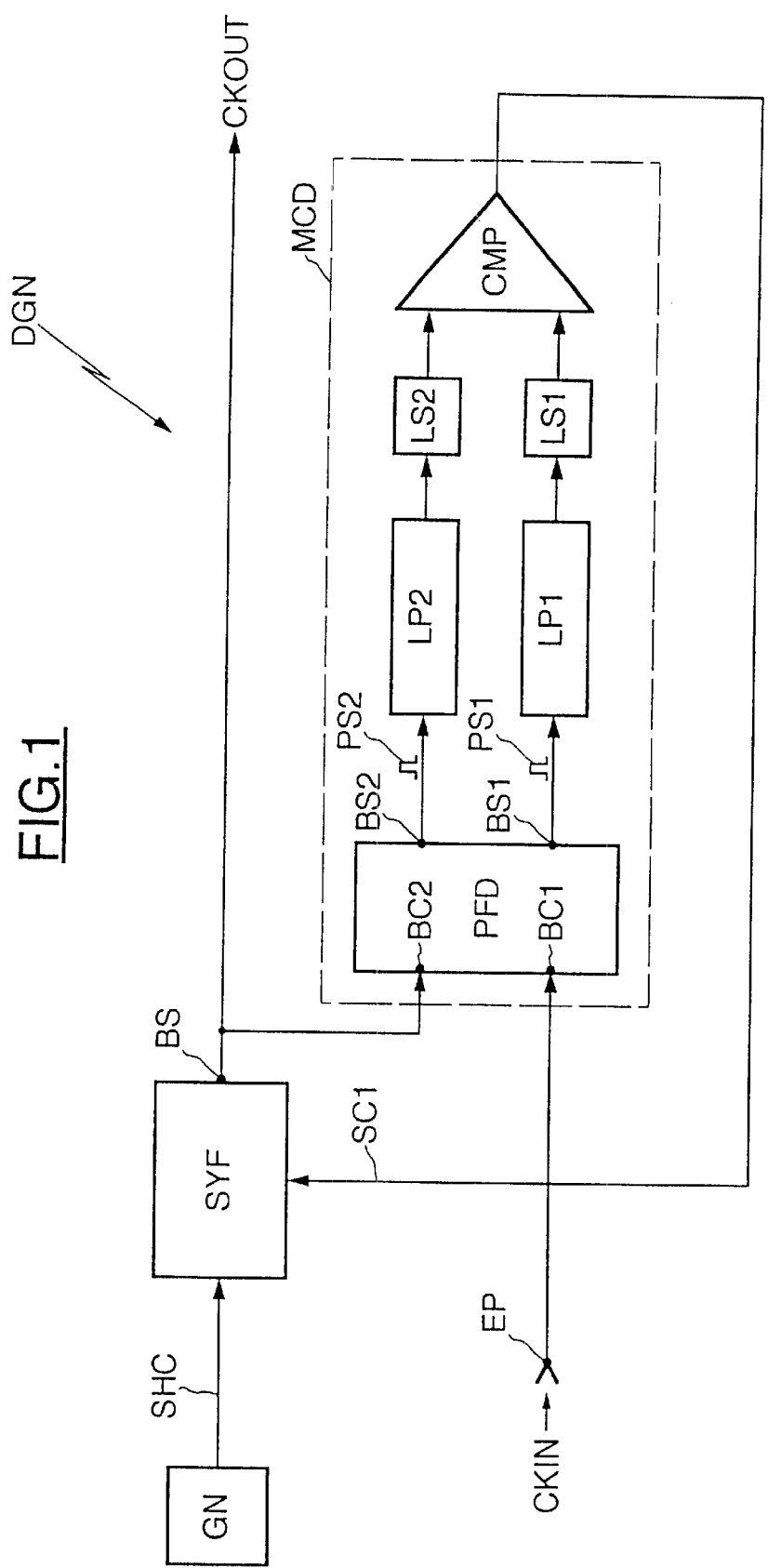
FIG. 1 illustrates a block diagram of a device for generating a clock signal, according to the present invention.

In FIG. 1, the reference EP denotes a main input for receiving a main clock signal CKIN having a predetermined and fixed main frequency. In the remainder of the text, F0 will denote the main frequency and F0 will denote the corresponding period. By way of example, the frequency F0 may be equal to 16.384 MHz.

The output terminal BS of the device DGN according to the invention delivers an output clock signal CKOUT from, as will be seen in greater detail below, the main clock signal CKIN and a so-called "secondary" clock signal SHC delivered, for example, by a quartz crystal whose frequency FQ may have a nominal value FQO equal to the frequency F0 of the main clock signal. The nominal frequency FQ0 of the quartz crystal may be chosen to be different from the frequency F0.

Figure 2:
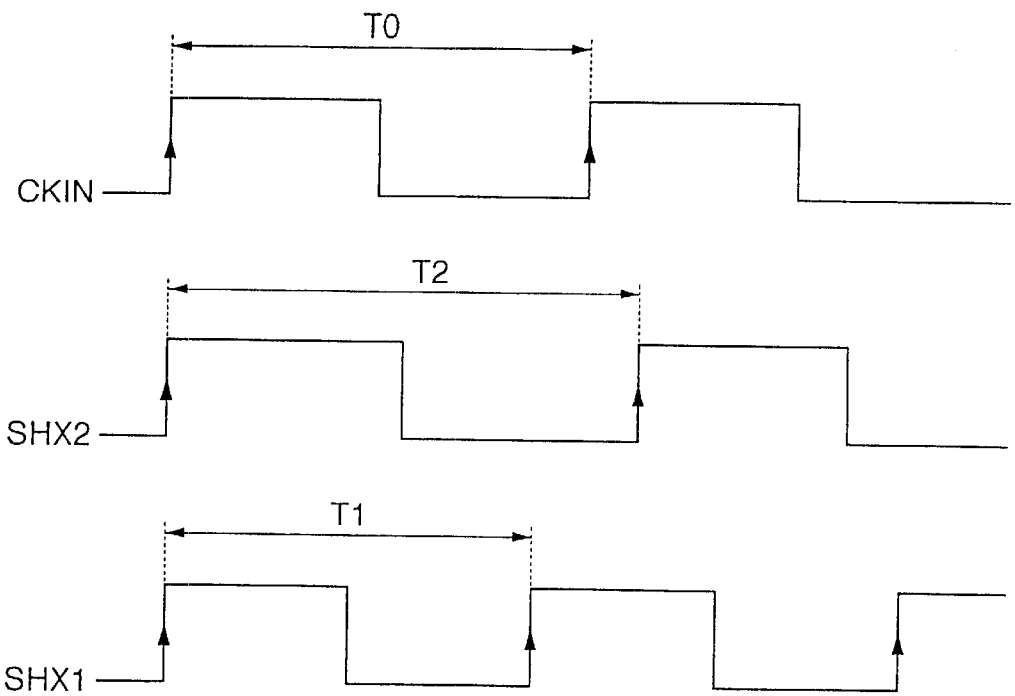
FIG. 2 illustrates signals preprogrammed into the frequency synthesizer.

The signal SHC delivered by the quartz crystal GN serves as reference for a frequency synthesizer SYF. This frequency synthesizer is preprogrammed to deliver exclusively and selectively, on the basis of the signal delivered by the quartz crystal, two auxiliary clock signals SHX1, SHX2 as best shown in FIG. 2. The first auxiliary clock signal SHX1 has a frequency F1 chosen to be slightly greater than the frequency F0. The frequency F2 of the second auxiliary clock signal SHX2 is chosen to be slightly below the frequency F0. The frequency F1 is equal to the frequency FO plus a predefined frequency gap $\Delta F$, for example, 50 ppm (F1=16.3848 MHz). The frequency F2 is equal to the frequency F0 minus this same frequency gap $\Delta F$ (F2= 16.3832 MHz).

Furthermore, the frequency FQ of the quartz crystal may vary around its nominal value within a predefined frequency range which depends on the accuracy AFQ of the quartz crystal. The frequency of the quartz crystal may vary between (FQ0−$\Delta$FQ) and (FQO+$\Delta$FQ). This also results in an accuracy of ±$\Delta$FQ in the frequencies F1 and F2 of the respective auxiliary signals SHX1 and SHX2. To avoid any risk of instability in the slaving loop made up of the synthesizer and the controller which will be described below, it is appropriate to choose a frequency gap $\Delta F$ which is greater than the accuracy $\Delta$FQ of the quartz crystal, even if very slightly such as 1 or 2 ppm, for example.

Any frequency synthesizer may be used in the device DGN. In particular, the frequency synthesizer is a fractional division frequency synthesizer, such as the one described in the article by Michael H. Perrott, titled "27-mW CMOS Fractional-N Synthesizer Using Digital Compensation for 2.5-Mb/s GFSK Modulation," IEEE Journal of Solid-State Circuits, Vol. 32, No. 12, December 1997. One of the inherent features of a frequency synthetizer, in particular a fractional division frequency synthetizer includes delivering only one output signal having a frequency which can be different depending on the preprogramming of the synthetizer. When the frequency of the output signal delivered by the synthetizer is modified to be equal to one of the two preprogrammed values, there is no jump in phase between the output signal delivered before the modification and the output signal delivered after the modification. This is particularly essential in the present invention, an object of which is to avoid any significant jumps in phase. The frequency synthesizer used in the device according to the invention is controlled by a control logic signal SC1 having two states. This control logic signal corresponds to one control bit, and is a signal which can take two voltage levels corresponding to the two states and to the two corresponding values of the control bit. For example, the first state of the control logic signal SC1 corresponds to a level of +5 volts, while the second state of the control logic signal SC1 corresponds to a level of 0 volts.

This control logic signal SC1 is delivered at the output of the controller MCD, the structure of which will now be described in greater detail. The controller MCD includes, at the front end, a phase and frequency detector PFD, of conventional structure which is well known to one skilled in the art. The phase and frequency detector PFD is constructed on the basis of logic gates. The phase and frequency detector PFD delivers, on its two outputs BS1 and BS2, pulses PS1 and PS2 whose respective durations depend on the phase difference of the signals present at the two inputs BC1 and BC2 of the detector PFD.

Two signals which are in phase at the input of the phase and frequency detector PFD cause the transmitting of two pulses PS1 and PS2 of identical duration. Likewise, two signals which are greatly out of phase present at the input of the detector PFD will also cause the transmitting of two pulses PS1 and PS2; however, one of these pulses will be of extremely small duration while the other will be of larger duration. Also, depending on the sign of the phase, any one of the pulses PS1 and PS2 can have the longer duration.

The respective pulses PS1 and PS2 are then delivered respectively into two low-pass filters LP1 and LP2 whose function is to average the level of the various pulses received at the input of the filters. The time constant of each filter may be chosen to be on the order of 1 is, for example. Each averaged level delivered by a filter is then raised in amplitude in a level-offsetting circuit LS1, LS2 of conventional structure. This raising of the level insures that the two values which will be compared with the comparator CMP are above the offset voltage of the comparator. Depending on the result of the comparison, the control logic signal SC1 will take either its first state or its second state.

The signal CKOUT is either the signal SHX1 or the signal SHX2. Each of these two auxiliary signals exhibits a frequency difference with respect to the main clock signal CKIN. This takes into consideration the fact that the frequency gap $\Delta F$ is greater than the accuracy $\Delta QF$ of the quartz crystal.

Figure 3:
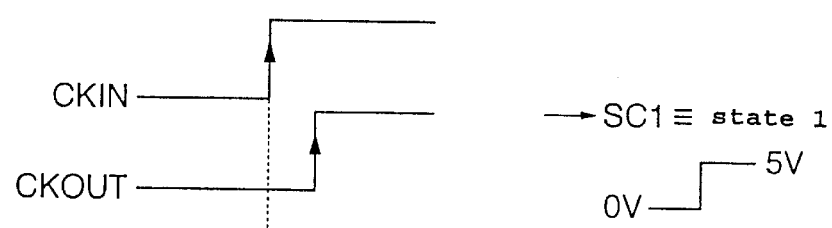
FIGS. 3 and 4 respectively illustrate first and second logic states of the control logic signal.

In the case illustrated in FIG. 3, the signal CKOUT exhibits a phase lag with respect to the signal CKIN. Also, when these two signals CKIN and CKOUT are respectively received at the two inputs of the phase and frequency detector PFD, the latter will deliver respectively on its two outputs a pulse PS2, for example, of longer duration than the pulse PS1. After comparison, this leads to the control logic signal SC1 being given its first state. This causes the synthesizer SYF to deliver on its output terminal the auxiliary signal SHX1 which has a frequency slightly above that of the signal CKIN.

Figure 4:
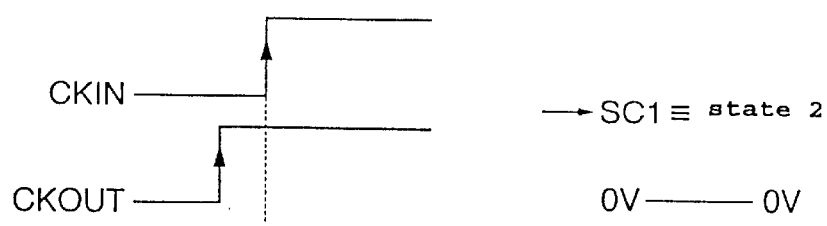

Likewise, in the case illustrated in FIG. 4, which corresponds to applying to the inputs of the phase and frequency detector PFD the signal CKIN and the signal CKOUT with a phase lead with respect to the signal CKIN. The average level of the pulses PS1 will now be greater than the average level of the pulses PS2. This causes the comparator CMP to give the control signal SC1 its second state. In response, the frequency synthesizer will deliver on its output terminal the signal SHX2 whose frequency is slightly below that of the signal CKIN.

Figure 5:
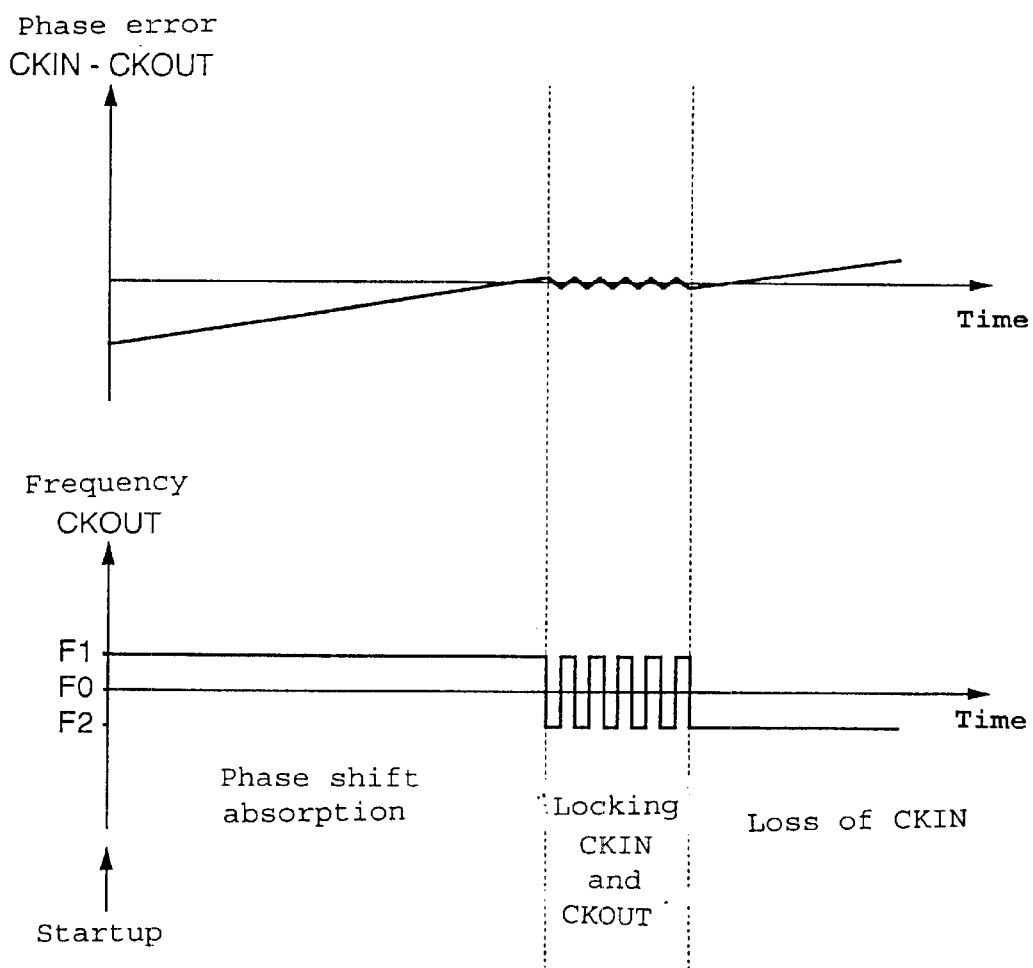
FIG. 5 illustrates time variations of the frequency and phase of the clock signal, according to the present invention.

A case of operation in the course of which a temporary loss of the signal CKIN will occur will now be described while referring more particularly to FIG. 5. It is firstly assumed that when the device is started up, the signal CKIN is present and the phase error CKIN-CKOUT is on the order of $-90°$. Hence, the configuration of FIG. 3 holds the signal CKOUT exhibiting a phase lag with respect to the signal CKIN. Under these conditions, the averaged level of the pulses PS2 will be greater than the averaged level of the pulses PS1.

This drives the signal SC1 into its first state. Consequently, the frequency synthesizer SYF will deliver on its output terminal the first auxiliary clock signal SHX1 having the frequency F1 slightly above the frequency F0. The phase error will be progressively reduced in a linear fashion. During this reduction phase, the frequency synthesizer SYF still delivers the auxiliary signal SHX1 at the frequency F1. When the phase error has been reduced, that is to say when the configuration of FIG. 4 holds again with the auxiliary signal SHX1 delivered by the frequency synthesizer SYF with a phase lead with respect to the signal CKIN, it is now the averaged level of the pulses PS1 which will be greater than the averaged level of the pulses PS2.

This causes the control logic signal SC1 to pass into its second state. Consequently, the frequency synthesizer SYF then switches over to the signal SHX2 of frequency F2. A phase of locking between the clock signal CKOUT and the clock signal CKIN is then re-entered. During this locking phase, and since the auxiliary signals SHX1 and SHX2 do not have exactly the same frequency as the signal CKIN, the synthesizer SYF will successively and alternately deliver the signals SHX2 and SHX1. The duration of delivery of an auxiliary signal is substantially equal to the time constant of the filters LP1 and LP2.

Should the signal CKIN be lost, corresponding to an absence of transition of this signal, the controller MCD will then regard the auxiliary signal delivered by the frequency synthesizer as having a phase lead with respect to the signal present on the terminal BC1 of the detector PFD, and will consequently place the control signal SC1 in its second state. This corresponds to the delivery of the signal SHX2 of frequency F2. The synthesizer will then deliver the signal SHX2 constantly as long as the signal CKIN does not reappear.

On the reappearance of the signal CKIN, the procedure just described in the phase error reduction phase will reoccur to linearly reduce the phase error between the signal CKIN, which has reappeared and the output signal CKOUT. In the phase of locking the clock signals CKIN and CKOUT, there is a very small structural jitter due to the successive switchings of the frequency synthesizer. This jitter is on the order of 6 picoseconds peak-to-peak with a frequency gap $\Delta F$ of 50 ppm in absolute value, which is negligible. Moreover, this frequency gap between the frequency of the output signal CKOUT and the frequency F0 of the signal CKIN remains limited to $\pm 50$ ppm, irrespective of the situation of the signal CKIN. If the accuracy $\Delta FQ$ of the quartz crystal is on the order of $\pm 50$ ppm, then as a result the device according to the invention makes it possible to generate a clock signal CKOUT whose gap in frequency with respect to the frequency F0 of the signal CKIN remains permanently below a predetermined threshold. In this instance around $\pm 100$ ppm.

The system according to the invention advantageously allows linear absorption of the phase error, thus making it possible to reduce this phase error much more rapidly than in the case of a conventional analog phase-locked loop.

That which is claimed is:

1. A method for generating an output clock signal from a main clock signal having a predetermined main frequency and from a secondary clock signal, the method comprising the steps of:

selectively generating as the output clock signal a first auxiliary clock signal responsive to a control logic signal having a first state, the first auxiliary clock signal having a first auxiliary frequency equal to the predetermined main frequency plus a predetermined frequency difference greater than a frequency accuracy of the secondary clock signal;

selectively generating as the output clock signal a second auxiliary clock signal responsive to the control logic signal having a second state, the second auxiliary signal having a second auxiliary frequency equal to the predetermined main frequency minus the predetermined frequency difference;

the first and second states of the control logic signal determining as a function of a phase difference between the output clock signal and the main clock signal, wherein a frequency difference with respect to the predetermined main frequency is below a predetermined threshold dependent upon the frequency difference and on the frequency accuracy of the secondary clock signal, even for a temporary loss of the main clock signal.

2. A method according to claim 1, wherein the control logic signal is in the first state when the output clock signal has a phase lag with respect to the main clock signal, and wherein the control logic signal is in the second state when the output clock signal has a phase lead with respect to the main clock signal.

3. A method according to claim 1, wherein the predetermined threshold has an absolute value of about 100 parts per million.

4. A method according to claim 1, wherein the frequency accuracy of the secondary clock signal is about 50 parts per million.

5. A method according to claim 1, wherein the frequency difference of the secondary clock signal to the predetermined main frequency is about 50 parts per million.

6. A method for generating an output clock signal from a main clock signal having a predetermined main frequency and from a secondary clock signal, the method comprising the steps of:
   selectively generating as the output clock signal a first auxiliary clock signal responsive to a control logic signal having a first state, the first auxiliary clock signal having a first auxiliary frequency equal to the predetermined main frequency plus a predetermined frequency difference greater than a frequency accuracy of the secondary clock signal; and
   selectively generating as the output clock signal a second auxiliary clock signal responsive to the control logic signal having a second state, the second auxiliary signal having a second auxiliary frequency equal to the predetermined main frequency minus the predetermined frequency difference.

7. A method according to claim 6, further comprising the step of determining a phase difference between the output clock signal and the main clock signal for generating the first and second states of the control logic signal.

8. A method according to claim 6, wherein a frequency difference with respect to the predetermined main frequency is below a predetermined threshold dependent upon the frequency difference and on the frequency accuracy of the secondary clock signal, even for a temporary loss of the main clock signal.

9. A method according to claim 6, wherein the control logic signal is in the first state when the output clock signal has a phase lag with respect to the main clock signal, and wherein the control logic signal is in the second state when the output clock signal has a phase lead with respect to the main clock signal.

10. A method according to claim 8, wherein the predetermined threshold has an absolute value of about 100 parts per million.

11. A method according to claim 8, wherein the frequency accuracy of the secondary clock signal is about 50 parts per million.

12. A method according to claim 8, wherein the frequency difference of the secondary clock signal to the predetermined main frequency is about 50 parts per million.

13. A clock circuit comprising:
   a generator providing a secondary clock signal;
   a frequency synthesizer receiving the secondary clock signal and a control logic signal, said frequency synthesizer selectively generating as the output clock signal a first auxiliary clock signal responsive to the control logic signal having a first state, the first auxiliary clock signal having a first auxiliary frequency equal to the predetermined main frequency plus a predetermined frequency difference greater than a frequency accuracy of the secondary clock signal, said frequency synthesizer selectively generating as the output clock signal a second auxiliary clock signal responsive to the control logic signal having a second state, the second auxiliary signal having a second auxiliary frequency equal to the predetermined main frequency minus the predetermined frequency difference; and
   a controller having a first control input receiving a main clock signal having a predetermined main frequency, and a second control input connected to an output of said frequency synthesizer for receiving the output clock signal, said controller providing the control logic signal in the first or second state as a function of a phase difference between the main clock signal and the output clock signal.

14. A clock circuit according to claim 13, wherein a frequency difference with respect to the predetermined main frequency is below a predetermined threshold dependent upon the frequency difference and on the frequency accuracy of the secondary clock signal, even for a temporary loss of the main clock signal.

15. A clock circuit according to claim 13, wherein said controller provides the control logic signal in the first state when the output clock signal has a phase lag with respect to the main clock signal, and provides the control logic signal in the second state when the output clock signal has a phase lead with respect to the main clock signal.

16. A clock circuit according to claim 13, wherein said controller comprises:
   a phase and frequency detector having a first input receiving the main clock signal and a second input receiving the output clock signal, and a first and second output providing pulses with respective durations dependent upon a phase difference between the main clock signal and the output clock signal;
   a first low-pass filter connected to the first output of said phase and frequency detector;
   a second low-pass filter connected to the second output of said phase and frequency detector; and
   a comparator having inputs connected to outputs of said first and second low-pass filters, and an output providing the control logic signal.

17. A clock circuit according to claim 13, further comprising:
   a first level-offsetting circuit connected between said first low-pass filter and said comparator; and
   a second level-offsetting circuit connected between said second low-pass filter and said comparator, said first and second level-offsetting circuits increasing a level of each signal filtered by said first and second low-pass filters by a same predetermined value.

18. A clock circuit according to claim 13, wherein said generator comprises quartz crystal.

19. A clock circuit according to claim 14, wherein the predetermined threshold has an absolute value of about 100 parts per million.

20. A clock circuit according to claim 14, wherein the frequency accuracy of the secondary clock signal is about 50 parts per million.

21. A clock circuit according to claim 14, wherein the frequency difference of the secondary clock signal is to the predetermined main frequency about 50 parts per million.

* * * * *